United States Patent
van Staveren et al.

(10) Patent No.: US 8,422,970 B1
(45) Date of Patent: Apr. 16, 2013

(54) RMS POWER DETECTION WITH SIGNAL-INDEPENDENT DYNAMICS AND RELATED APPARATUS, SYSTEM, AND METHOD

(75) Inventors: Arie van Staveren, Hazerswoude (NL); Michael Hendrikus Laurentius Kouwenhoven, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 758 days.

(21) Appl. No.: 12/583,615

(22) Filed: Aug. 24, 2009

Related U.S. Application Data

(60) Provisional application No. 61/190,392, filed on Aug. 28, 2008.

(51) Int. Cl.
*G06F 3/033* (2006.01)
(52) U.S. Cl.
USPC ........... 455/130; 455/230; 327/348; 327/104; 327/356
(58) Field of Classification Search .................. 455/130, 455/230; 327/348, 104, 356
See application file for complete search history.

(56) References Cited

U.S. PATENT DOCUMENTS

| | | | |
|---|---|---|---|
| 3,723,845 | A | 3/1973 | Duckworth |
| 5,450,494 | A * | 9/1995 | Okubo et al. .................. 381/57 |
| 5,486,788 | A | 1/1996 | Schlager et al. |
| 5,489,868 | A | 2/1996 | Gilbert |
| 6,172,549 | B1 * | 1/2001 | Gilbert .......................... 327/349 |
| 6,204,719 | B1 | 3/2001 | Gilbert |
| 6,348,829 | B1 | 2/2002 | Gilbert |
| 6,359,576 | B1 | 3/2002 | Petrofsky |
| 6,380,801 | B1 | 4/2002 | McCartney |
| 6,429,720 | B1 | 8/2002 | Gilbert |
| 6,437,630 | B1 * | 8/2002 | Gilbert .......................... 327/348 |
| 6,445,726 | B1 | 9/2002 | Gharpurey |

(Continued)

FOREIGN PATENT DOCUMENTS

| KR | 1020010087635 A | 9/2001 |
|---|---|---|
| KR | 1020060130823 A | 12/2006 |

OTHER PUBLICATIONS

Asad A. Abidi, "RF CMOS Comes of Age", IEEE Journal of Solid-State Circuits, vol. 39, No. 4, Apr. 2004, p. 549-561.

(Continued)

*Primary Examiner* — Temesgh Ghebretinsae
*Assistant Examiner* — Richard Chan
(74) *Attorney, Agent, or Firm* — Eugene C. Conser; Wade J. Brady, III; Frederick J. Telecky, Jr.

(57) ABSTRACT

A circuit is configured to receive an input signal and to produce an output signal measuring a power of the input signal. The circuit includes a multiplier cell configured to multiply first and second signals, where each of the first and second signals includes a component related to the input signal and a component related to the output signal. The circuit also includes a controlled amplifier configured to amplify an intermediate signal produced by the multiplier cell, where an amplification provided by the controlled amplifier is a function of the output signal. The circuit could further include at least one first converting amplifier configured to generate the component related to the input signal and at least one second converting amplifier configured to generate the component related to the output signal. Transconductances of the converting amplifiers could be selected to configure the circuit as a linear or logarithmic RMS power detector.

12 Claims, 3 Drawing Sheets

U.S. PATENT DOCUMENTS

| | | | |
|---|---|---|---|
| 6,549,057 B1* | 4/2003 | Gilbert | 327/349 |
| 6,639,460 B1 | 10/2003 | Bolker | |
| 6,674,322 B2 | 1/2004 | Motz | |
| 6,707,336 B2 | 3/2004 | Reber | |
| 7,002,394 B1 | 2/2006 | Gilbert | |
| 7,197,292 B1 | 3/2007 | Kouwenhoven et al. | |
| 7,342,431 B2 | 3/2008 | Zou | |
| 7,697,909 B2 | 4/2010 | Kouwenhoven | |
| 2002/0103627 A1 | 8/2002 | Petrofsky | |
| 2003/0030478 A1 | 2/2003 | Gilbert | |
| 2007/0270116 A1 | 11/2007 | Kouwenhoven | |
| 2008/0181337 A1* | 7/2008 | Maxim | 375/340 |

OTHER PUBLICATIONS

Anton Bakker, et al., "A CMOS Nested Chopper Instrumentation Amplifier with 100nV Offset", 2000 IEEE International Solid-State Circuits Conference, Feb. 8, 2000, pp. 156-157, 452.

Klaas Bult, et al., "A Class of Analog CMOS Circuits Based on the Square-Law Characteristic of an MOS Transistor in Saturation", IEEE Journal of Solid-State Circuits, vol. sc-22, No. 3, Jun. 1987, p. 357-365.

Christian C. Enz, et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, p. 1584-1614.

Barrie Gilbert, "A New Wide-Band Amplifier Technique", IEEE Journal of Solid-State Circuits, vol. sc-3, No. 4, Dec. 1968, p. 353-365.

Barrie Gilbert, "A Precise Four-Quadrant Multiplier with Subnanosecond Response", IEEE Journal of Solid-State Circuits, vol. 3, No. 4, Dec. 1968, p. 365-373.

Katsuji Kimura, "A Bipolar Four-Quadrant Analog Quarter-Square Multiplier Consisting of Unbalanced Emitter-coupled Pairs and Expansions of its Input Ranges", IEEE Journal of Solid-State Circuits, vol. 29, No. 1, p. 46-55.

Katsuji Kimura, "Some Circuit Design Techniques for Low-Voltage Analog Functional Elements Using Squaring Circuits", IEEE Transactions on Circuits and Systems I: Fundamenlal Theory and Applications, vol. 43, No. 7, Jul. 1996, p. 559-576.

David C. Soo, et al., "A Four-Quadrant NMOS Analog Multiplier", IEEE Journal of Solid-State Circuits, vol. SC-17, No. 6, Dec. 1982, p. 1174-1178.

Barrie Gilbert, "Novel Technique for R.M.S.-D.C. Conversion Based on the Difference of Squares", Electronics Letters, vol. 11, No. 8, Apr. 17, 1975, p. 181-182.

M. Kouwenhoven, et al., "A 2GHz Mean-Square Power Detector with Integrated Offset Chopper", 2005 IEEE International Solid-State Circuits Conference, Feb. 5, 2005, p. 19-20.

International Search Report dated Jan. 4, 2008 in connection with International Patent Application No. PCT/US2007/017370.

Notice of Allowance dated Dec. 14, 2006 in connection with U.S. Appl. No. 10/932,469.

International Preliminary Report on Patentability dated Feb. 12, 2009 in connection with International Patent Application No. PCT/US2007/017370.

* cited by examiner

US 8,422,970 B1

RMS POWER DETECTION WITH SIGNAL-INDEPENDENT DYNAMICS AND RELATED APPARATUS, SYSTEM, AND METHOD

CROSS-REFERENCE TO RELATED APPLICATIONS

This application claims priority under 35 U.S.C. §119(e) to U.S. Provisional Application No. 61/190,392 filed on Aug. 28, 2008, which is hereby incorporated by reference.

This application is related to U.S. Pat. No. 7,197,292 and U.S. Pat. Publication No. 2007/0270116, which are also hereby incorporated by reference.

TECHNICAL FIELD

This disclosure is generally directed to power detection and more specifically to root-mean-square (RMS) power detection with signal-independent dynamics and related apparatus, system, and method.

BACKGROUND

Root-mean-square (RMS) detection is becoming a key building block in mobile telephones and other wireless devices. For example, various architectures for RMS power detection are disclosed in U.S. Pat. Publication No. 2007/0270116. Those architectures generally apply feedback to enable highly accurate and temperature-independent RMS power detection. Those architectures can include a multiplier and, depending on the type of RMS detection, other non-linear elements in a feedback path. In those architectures, the small-signal loop gain and the dynamic performance of the architectures depend on the applied input signal level.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
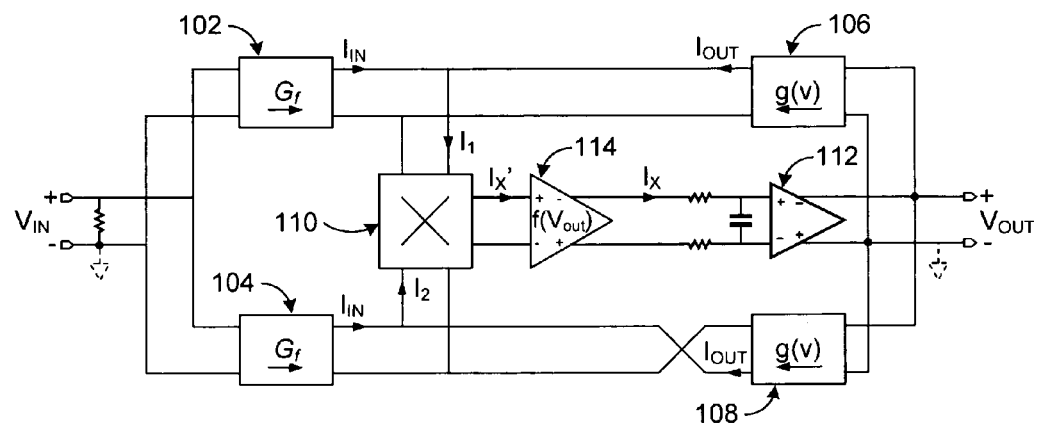
FIG. 1 illustrates an example root-mean-square (RMS) power detector with signal-independent dynamics according to this disclosure.

FIG. 1 illustrates an example root-mean-square (RMS) power detector 100 with signal-independent dynamics according to this disclosure. The embodiment of the RMS power detector 100 shown in FIG. 1 is for illustration only. Other embodiments of the RMS power detector 100 could be used without departing from the scope of this disclosure.

As shown in FIG. 1, the RMS power detector 100 receives an input signal across its input terminals. The RMS power detector 100 operates to produce an output signal, which measures the RMS level of the input signal, across its output terminals. Depending on the configuration, the input terminals could receive a differential input signal or a single-ended input signal (where one input terminal is grounded). Similarly, the output terminals could provide a differential output signal or a single-ended output signal (where one output terminal is grounded). In general, the RMS power detector 100 uses an architecture that has a small-signal loop gain and therefore a dynamic performance independent of the applied power level of the input signal. In other words, the small-signal loop gain and the dynamic performance of the RMS power detector 100 do not vary depending on the detector's input signal level.

In the example embodiment shown in FIG. 1, the input signal represents an input voltage $V_{IN}$ (such as a radio frequency signal), and the output signal represents an output voltage $V_{OUT}$ (such as a lower-frequency signal). In the following discussion, it is assumed that the detector 100 is receiving an input voltage $V_{IN}$ and producing an output voltage $V_{OUT}$, as well as producing and using various currents. However, this disclosure is not limited to any particular arrangement of currents and voltages. In principle, any of the signals mentioned in this patent document could be changed from a current to a voltage or vice versa without departing from the scope of this disclosure.

Here, the input voltage $V_{IN}$ is provided to two voltage-to-current amplifiers 102-104, which convert the input voltage $V_{IN}$ into substantially equal input-related currents $I_{IN}$. The voltage-to-current amplifiers 102-104 also provide a gain and have a transconductance denoted $G_f$. The outputs of the voltage-to-current amplifiers 102-104 are connected to the outputs of two voltage-to-current amplifiers 106-108, which convert the output voltage $V_{OUT}$ into substantially equal output-related currents $I_{OUT}$. The voltage-to-current amplifiers 106-108 also provide a gain and have a general transconductance denoted $g(v)$. Note that the outputs of the voltage-to-current amplifier 108 are crossed or inverted compared to the outputs of the voltage-to-current amplifier 106, which inverts the output-related current $I_{OUT}$ from the voltage-to-current amplifier 108. Each of the voltage-to-current amplifiers 102-108 includes any suitable structure for converting a voltage into a corresponding current and for providing amplification.

The RMS power detector 100 also includes a multiplier cell 110 having inputs for receiving two multiplication inputs, namely currents $I_1$ and $I_2$. Each current $I_1$ and $I_2$ has a component related to the output voltage $V_{OUT}$ and a component related to the input voltage $V_{IN}$ (where those components are provided by the voltage-to-current amplifiers 102-108). The multiplier cell 110 multiplies the currents $I_1$ and $I_2$ to produce an intermediate current $I_x'$. The multiplier cell 110 includes any suitable structure for multiplying input signals, such as a mixer.

The RMS power detector 100 further includes an amplifier 112. The amplifier 112 receives a current $I_x$ and performs amplification to produce the output voltage $V_{OUT}$. The amplifier 112 includes any suitable structure for providing amplification in order for the detector 100 to obtain a high loop gain.

In this example, one input of the multiplier cell 110 receives the signal:

$$I_1 = I_{IN} + I_{OUT}$$

and another input of the multiplier cell 110 receives the signal:

$$I_2 = I_{IN} - I_{OUT}.$$

The intermediate current $I_x'$ from the multiplier cell 110 equals the product of these two signals, which can be expressed as:

$$I_x' = k \cdot I_1 \cdot I_2 = k \cdot (I_{IN} + I_{OUT}) \cdot (I_{IN} - I_{OUT}) = k \cdot (I_{IN}^2 - I_{OUT}^2)$$

where k is a constant. As a result of the gain in the overall loop, the current $I_x'$ from the multiplier cell 110 is made zero. Consequently, the following relation is forced:

$$I_{IN}^2 = I_{OUT}^2.$$

As the power of a signal relates linearly to the square of its current or voltage, this shows that the power of the detector's output signal is made equal to the power of the detector's input signal. By means of an appropriate selection of the feedback transconductance g(v), several types of RMS power detectors can be realized. Two common ones are:

Linear RMS (LIN-RMS) detector: Selecting g(v)=G yields:

$$V_{OUT}(t) = \frac{G_1}{G}\sqrt{\int V_{IN}^2(t)dt};$$

and

Logarithmic RMS (LOG-RMS) detector: Selecting g(v)= $I_x^* \exp(V/V_0)$ yields:

$$V_{OUT}(t) = V_0 \log\left(\frac{G_f}{I_x}\sqrt{\int V_{IN}^2(t)dt}\right).$$

This approach potentially provides highly accurate and temperature stable power detectors. If the loop gain of this system is high, the input-output relation for the power detector 100 is determined by the transconductances $G_f$ and g(v). However, without more, the dynamics of the power detector 100 may be dependent on the input power level, resulting in a loop gain that can depend on the detector's input signal. A loop gain that is input signal-dependent may be undesirable for several reasons:

The dynamics of the detector depend on the input signal level. For instance, the rise time for a step response depends on the applied signal levels. When the loop gain varies by one order of magnitude, the rise time potentially varies also by one order of magnitude.

A feedback loop needs an appropriate design with respect to stability. The loop gain dependency on the input signal can hamper a proper design of the loop. Depending on the selection of g(v) and the required signal range, it might even be impossible.

As particular examples, the loop gain for a LIN-RMS device can vary by 40 dB over a 40 dB input dynamic range, while the loop gain for a LOG-RMS device can vary by 80 dB. This can give some significant complicating constraints for the design of these devices.

To help the dynamics and loop gain of the power detector 100 be substantially independent of the input power level, the RMS power detector 100 includes at least one controlled amplifier 114. The controlled amplifier 114 provides amplification as a function of the output signal, where that function is denoted in this example as $f(V_{OUT})$. The controlled amplifier 114 produces the current $I_x$ that is provided to the amplifier 112 for use in producing the output voltage $V_{OUT}$. Since the gain of the controlled amplifier 114 can be a function of the detector's output signal, its gain is thus a function of the RMS value of the detector's input signal. The amplifier 114 can therefore be used to make the loop gain of the RMS power detector 110 independent of the input power level. The amplifier 114 includes any suitable structure for providing controlled amplification. Additional details regarding this controlled amplification are provided below.

Although FIG. 1 illustrates one example of an RMS power detector 100 with signal-independent dynamics, various changes may be made to FIG. 1. For example, the RMS power detector 100 shown in FIG. 1 uses the basic architecture of an RMS detector disclosed in U.S. Pat. Publication No. 2007/0270116. This is for illustration and explanation only. The same or similar technique could be used in any other suitable device or system, such as in the "choppers" described in U.S. Pat. No. 7,197,292. Also, the RMS power detector 100 is not limited to use as an RF power detector and can be used with other types of devices, such as other RMS circuits based on the principles outlined in U.S. Pat. No. 7,197,292.

Figure 2A:
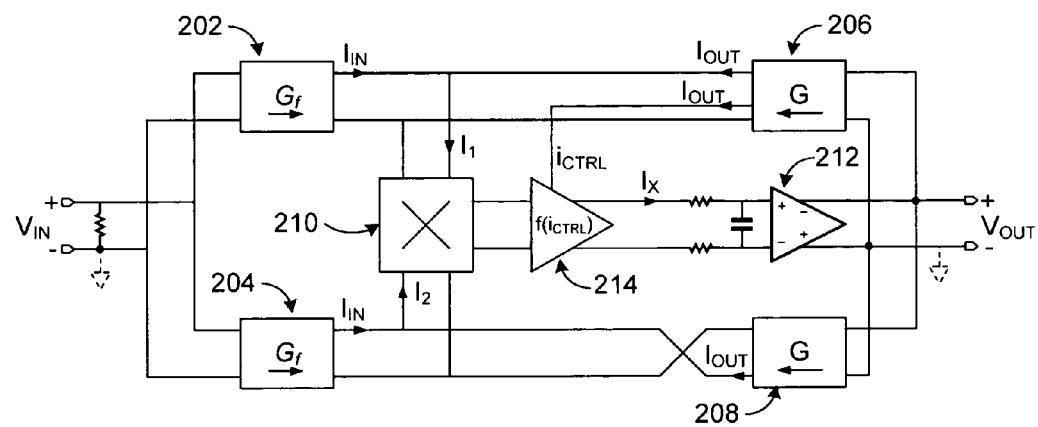
FIGS. 2A and 2B illustrate more specific examples of RMS power detectors with signal-independent dynamics according to this disclosure.
Figure 2B:
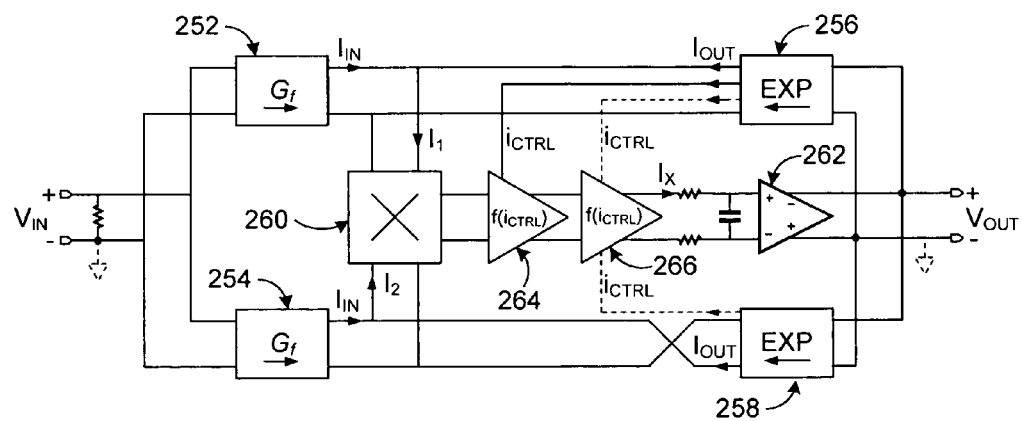

FIGS. 2A and 2B illustrate more specific examples of RMS power detectors 200 and 250 with signal-independent dynamics according to this disclosure. The embodiments of the RMS power detectors 200 and 250 shown in FIGS. 2A and 2B are for illustration only. Other embodiments of the RMS power detectors 200 and 250 could be used without departing from the scope of this disclosure.

As shown in FIG. 2A, the RMS power detector 200 represents a linear RMS detector (LIN-RMS) that implements the basic principles shown in FIG. 1 and described above. Many of the components 202-214 in FIG. 2A may therefore be the same as or similar to the corresponding components 102-114 shown in FIG. 1 and described above. However, the voltage-to-current amplifier 206 has an additional output, namely one that provides the output-related current $I_{OUT}$ (or a scaled version thereof) to a controlled amplifier 214 as a control current $I_{CTRL}$. Also, the controlled amplifier 214 operates and provides a gain as a function of the control current $I_{CTRL}$. With that gain, the loop gain LG of the detector 200 can be expressed as:

$$LG = -\frac{2G^2 \cdot V_{OUT}}{I_0} \cdot A \cdot f(V_{OUT}) = C \Leftrightarrow f(V_{OUT}) \propto \frac{1}{V_{OUT}} \propto \frac{1}{I_{OUT}}$$

where C represents a constant, G represents the transconductance of the voltage-to-current amplifiers 206-208, A represents the gain of the amplifier 212, and $I_0$ represents a reference current setting the conversion gain of the multiplier cell 210 (to have a dimensionless loop gain).

Given the location of the controlled amplifier 214 in the architecture shown in FIG. 2A, the gain of the controlled amplifier 214 can be expressed as:

$$A_i = \frac{I_X}{I_X'} = \frac{I_B}{I_{CTRL}}$$

where $I_B$ represents a constant current. This type of controlled current amplifier can be implemented in any suitable manner, such as by using trans-linear circuits. As shown here, to create a control signal for the controlled amplifier 214, a (possibly scaled) copy of the output-related current $I_{OUT}$ from one of the voltage-to-current amplifiers 206-208 is used. Applying the controlled amplifier 214 in this manner yields a loop gain described by:

$$LG = -\frac{2G^2 \cdot V_{OUT}}{I_0} \cdot A \cdot f(V_{OUT}) = -\frac{2G^2 \cdot V_{OUT}}{I_0} \cdot A \cdot A_i$$

$$= -\frac{2G^2 \cdot V_{OUT}}{I_0} \cdot A \cdot \frac{I_B}{I_{OUT}} = -\frac{2G^2 \cdot V_{OUT}}{I_0} \cdot A \cdot \frac{I_B}{G \cdot V_{OUT}}$$

$$= -\frac{2G \cdot I_B}{I_0} \cdot A$$

which is independent of the applied input signal level.

As shown in FIG. 2B, an RMS power detector 250 represents a logarithmic RMS detector (LOG-RMS) that implements the basic principles shown in FIG. 1 and described above. Again, many of the components 252-266 in FIG. 2B may therefore be the same as or similar to the corresponding components 102-114 shown in FIG. 1 and described above. However, in this example, the voltage-to-current amplifiers 256-258 are exponential voltage-to-current amplifiers with exponential transconductances, such as $I_x*\exp(V/V_0)$. Also, the RMS power detector 250 includes two controlled amplifiers 264-266. Further, the voltage-to-current amplifier 256 can provide the output-related current $I_{OUT}$ (or a scaled version thereof) to the controlled amplifier 264 as a control current $I_{CTRL}$, and the voltage-to-current amplifier 256 or 258 can provide the output-related current $I_{OUT}$ (or a scaled version thereof) to the controlled amplifier 266 as a control current $I_{CTRL}$. In addition, each of the controlled amplifiers 264-266 operates and provides a gain as a function of its control current $I_{CTRL}$. With these gains, the detector 250 has a loop gain that can be expressed as:

$$LG = -\frac{2 \cdot I_x \exp^2\left(\frac{V_{out}}{V_o}\right)}{V_0 \cdot I_0} \cdot A \cdot f(V_{out}) = C \Longleftrightarrow f(V_{out}) \propto \frac{1}{\left[\exp\left(\frac{V_{out}}{V_0}\right)\right]^2} \propto \frac{1}{I_{OUT}^2}$$

where $V_0$ represents a reference voltage in the transfer of the exponential amplifiers 256-258 (to have a dimensionless loop gain).

The total gain of the controlled amplifiers 264-266 may depend inversely proportionally on the square of the current $I_{OUT}$. In the embodiment shown in FIG. 2B, a cascade of two controlled amplifiers are used to prevent currents from varying extensively (such as four orders of magnitude for a 40 dB RF input power range), and two copies of the output-related current $I_{OUT}$ from one or both of the voltage-to-current amplifiers 256-258 are provided to the controlled amplifiers 264-266. Calculating the loop gain for this architecture yields:

$$LG =$$

$$-\frac{2 \cdot I_x \exp^2\left(\frac{V_{out}}{V_o}\right)}{V_0 \cdot I_0} \cdot A \cdot f(V_{out}) = -\frac{2 \cdot I_{OUT}^2}{V_0 \cdot I_0} \cdot A \cdot \frac{I_B}{I_{OUT}} \cdot \frac{I_B}{I_{OUT}} = -\frac{2 \cdot I_B^2}{V_o \cdot I_0} \cdot A$$

which is again independent of the applied input signal level. Note, however, that the use of two controlled amplifiers is not required, and the necessary amplification could be provided in FIG. 2B using a single amplifier (such as one implemented using trans-linear circuits) or by a cascade of three or more amplifiers.

In both of these architectures, the control current $I_{CTRL}$ is derived from one or more of the output-related currents $I_{OUT}$ produced by one or more of the feedback voltage-to-current amplifiers. More generally speaking, what may be needed for this solution to function are:

1. $+I_{OUT}$ for the signal on one of the multiplier cell's inputs;
2. $-I_{OUT}$ for the signal on another of the multiplier cell's inputs; and
3. one or more $I_{OUT}$ signals for one or more controlled amplifiers.

In principle, the $I_{OUT}$ signals can be generated by one or more of the voltage-to-current amplifiers, possibly in combination with copiers and inverters. For instance, the architecture in FIG. 2B could also be implemented using one exponential voltage-to-current converter (instead of two) in combination with a block that makes four copies of the $I_{OUT}$ signal:

(1) one copy for a first input of the multiplier cell 260;
(2) two copies for the controlled amplifiers 264-266; and
(3) one copy sent to an inverter to make an inverted $I_{OUT}$ signal for a second input of the multiplier cell 260.

It may also be noted that the controlled amplifiers used here can be relatively low-frequency circuits. For example, the controlled amplifiers could minimally be a factor of two times faster compared to the required lower-frequency bandwidth of the detector. For a cascade of two controlled amplifiers, this factor of two can apply to the cascade of amplifiers as a whole rather than each individual amplifier. Taking into account that the lower-frequency bandwidth of a detector is typically on the order of several hundred kilohertz, a bandwidth of 1 MHz may be sufficient for the controlled amplifier(s).

For optimizing the overall performance of these types of detectors, the actual location of the one or more controlled amplifiers inside the feedback loop may vary, as long as they are behind the multiplier cell in the forward path (between the multiplier cell and the power detector's output) and not in the feedback path. This allows for distributing the gain over different locations in the forward path, which allows for optimizing the performance of the detector with respect to other small-signal behavior aspects as well.

Although FIGS. 2A and 2B illustrate two more specific examples of RMS power detectors 200 and 250 with signal-independent dynamics, various changes may be made to FIGS. 2A and 2B. For example, as noted above, the number and location(s) of the controlled amplifiers can vary. Also, the exponential voltage-to-current amplifiers could be implemented as separate exponential amplifier and voltage-to-current amplifier. In addition, while LIN-RMS and LOG-RMS detectors were shown and described above, any suitable RMS detector could use one or more controlled amplifiers in the forward loop in the same or similar manner as described above to obtain signal-independent dynamics.

It may also be noted that the various resistors and capacitors shown in FIGS. 1, 2A, and 2B could have any suitable resistances and capacitances, respectively. Moreover, it may again be noted that various signals are labeled here as being voltages and currents and that various operations are described as conversions from voltages to currents. However, this disclosure is not limited to any particular arrangement of currents and voltages. Any signal could be changed from a current to a voltage or vice versa according to particular needs. Moreover, the phrase "converting amplifier" may be used to denote either a voltage-to-current amplifier or a current-to-voltage amplifier, the specific choice depending on the type of conversion required given the arrangement of currents and voltages being used.

Figure 3:
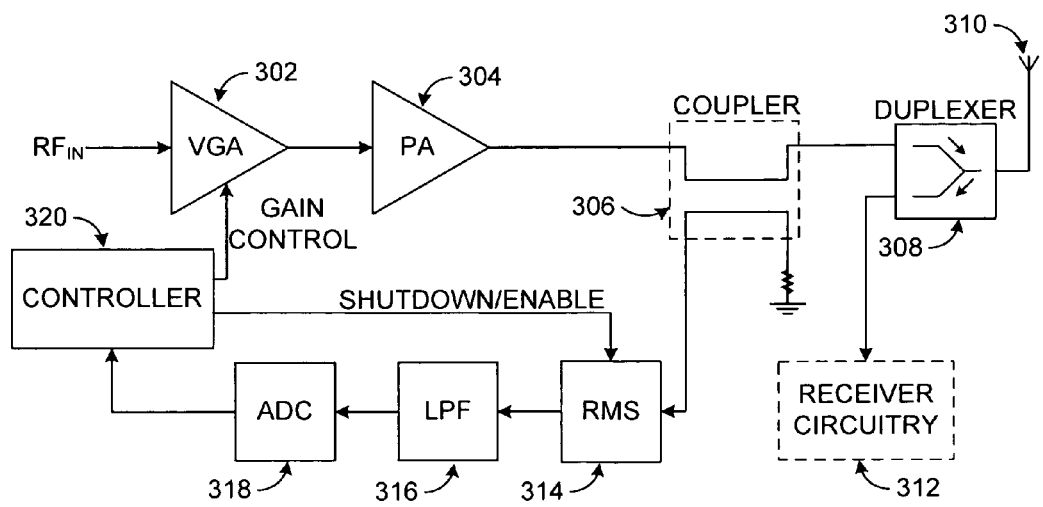
FIG. 3 illustrates an example wireless device using an RMS power detector with signal-independent dynamics according to this disclosure.

FIG. 3 illustrates an example wireless device 300 using an RMS power detector with signal-independent dynamics according to this disclosure. The embodiment of the wireless device 300 shown in FIG. 3 is for illustration only. Other embodiments of the wireless device 300 could be used without departing from the scope of this disclosure.

As shown in FIG. 3, a radio frequency input signal $RF_{IN}$ is provided to a variable gain amplifier (VGA) 302, which performs a controllable amount of amplification (gain) as specified by a gain control signal. The amplified signal is provided to a power amplifier (PA) 302, which generally operates to supply the power to be transmitted and again amplifies the RF signal. The variable gain amplifier 302 includes any suitable structure for providing adjustable gain, and the power amplifier 304 includes any suitable structure for providing power amplification.

The amplified signal is passed through a coupler 306 and a duplexer 308 to an antenna 310 for transmission. The coupler 306 generally represents a structure capable of coupling part of the transmitted power, such as a fixed portion (like around 10%), to feedback components described below. A resistor coupled to the coupler 306 could have any suitable resistance, such as 50Ω. The duplexer 308 generally represents a switch that either redirects a signal to be transmitted to the antenna 310 or redirects a received signal from the antenna 310 to receiver circuitry 312. The antenna 310 represents any suitable structure for transmitting and/or receiving wireless signals, such as an RF antenna. The receiver circuitry 312 represents any suitable structure for processing received signals.

In these types of devices, wireless signals are transmitted via the antenna 310, and the power level of the transmitted signals often needs to be measured. In this example, the feedback components in the wireless device 300 include an RMS power detector 314, a low-pass filter (LPF) 316, an analog-to-digital converter (ADC) 318, and a controller 320. The RMS power detector 314 uses the signals provided by the coupler 306 to determine the power of the RF signals being transmitted by the wireless device 300. The RMS power detector 314 could represent any of the RMS power detectors 100, 200, 250 described above or any other RMS power detector that uses one or more controlled amplifiers in the forward path to provide signal-independent dynamics.

The low-pass filter 316 filters the power measurements produced by the RMS power detector 314 to filter noise from the measurements. The low-pass filter 316 represents any suitable filter, such as an RC or other filter, with any suitable passband. The filtered measurements are digitized by the analog-to-digital converter 318, which generates digital values corresponding to the filtered measurements. The analog-to-digital converter 318 includes any suitable structure for converting analog values into digital values.

The digitized power measurements are used by the controller 320 to adjust the gain of the variable gain amplifier 302. For example, the controller 320 could compare the power measurements to a setpoint and increase or decrease the gain of the variable gain amplifier 302 to provide more or less amplification to obtain a required or desired transmit power level. The controller 320 could also provide enable or shutdown signals to the RMS power detector 314 so that the RMS power detector 314 can be activated or placed in a low-power state, respectively. The controller 320 includes any suitable structure for controlling operation of the wireless device 300. As particular examples, the controller 320 could represent a processor, microprocessor, microcontroller, field programmable gate array, digital signal processor, or other processing or control device.

In some embodiments, the RMS power detectors 100, 200, 250, 314 can be packaged as a single integrated circuit chip, such as in a 0.4 mm pitch microSMD package. In particular embodiments, the RMS power detector 250 represents a 35 dB logarithmic RMS power detector suited for accurate power measurement of RF modulated signals that exhibit large peak-to-average ratios (large variations of the signal envelope). Such noise-like signals can be encountered in applications such as CDMA or wideband CDMA mobile telephones, GSM or GPRS mobile telephones, or IEEE 802.11b, 802.11g, or 802.11n WLAN devices. In these particular embodiments, the RMS power detector 250 could have an RF frequency range of 50 MHz-3.5 GHz, have an output voltage range of 10 mV-1.8V, provide an accurate temperature and supply compensated output voltage (such as ±0.5 dB) that relates linearly to the RF input power in dBm, operate with a single supply from 2.7V-3.3V, and have an RF power detection range from −30 dBm to +5 dBm. Moreover, the outputs of the RMS power detectors 100, 200, 250, 314 could have a high impedance when shut down or placed in an inactive state to save power and prevent discharge of an external filter capacitance.

One important requirement for an RF power detector is typically its accuracy. For example, the total error budget of the transmit path relative to the transmitted power level could be on the order of 2 dB. More headroom is available for other system blocks if the RF power detector is more accurate. As a particular example, with the introduction of the 3G communication standard, the nature of the signals to be transmitted has changed significantly with respect to the 2G standard. As a result, a different approach is required for 3G to implement power detection. Where a kind of peak detection of a transmitted signal showed to be accurate enough for 2G signals, a real power measurement needs to be done for 3G signals. One reason is that the 3G signals exhibit a much wider range of peak-to-average ratios (PAR) than the 2G signals. This is particularly true for 3G release 5 and higher that support the High-Speed Packet Access (HSPA) service, which has significantly higher PARs. Peak detection can be used in combination with correction factors based on a-priori knowledge of the PAR (type of signal). However, for 3G signals, there are a large number of possibilities, yielding a huge number of different correction factors depending on the signal. The RMS power detectors 100, 200, 250 described above can be used as the RMS power detector 314 in the wireless device 300 to enable true power measurements independent of the applied input signal. Parameters such as PAR and modulation scheme may not influence the power measurements. One advantage of this technique is that it does not require a huge table to obtain the required accuracy for 3G systems.

Although FIG. 3 illustrates one example of a wireless device 300 using an RMS power detector with signal-independent dynamics, various changes may be made to FIG. 3. For example, if the wireless device 300 is a transmit-only device, the duplexer 308 and receiver circuitry 312 could be omitted. Also, while the wireless device 300 is shown and described as transmitting RF signals, the wireless device 300 could be used to transmit any other suitable wireless signals. In addition, an RMS power detector with signal-independent dynamics could be used in any other suitable device or system. For instance, it may be noted that the RMS detectors described above could be used in any mobile telephones, wireless telephones (such as DECT or other portable phones), personal digital assistants, laptop computers, or any other or additional devices.

Figure 4:
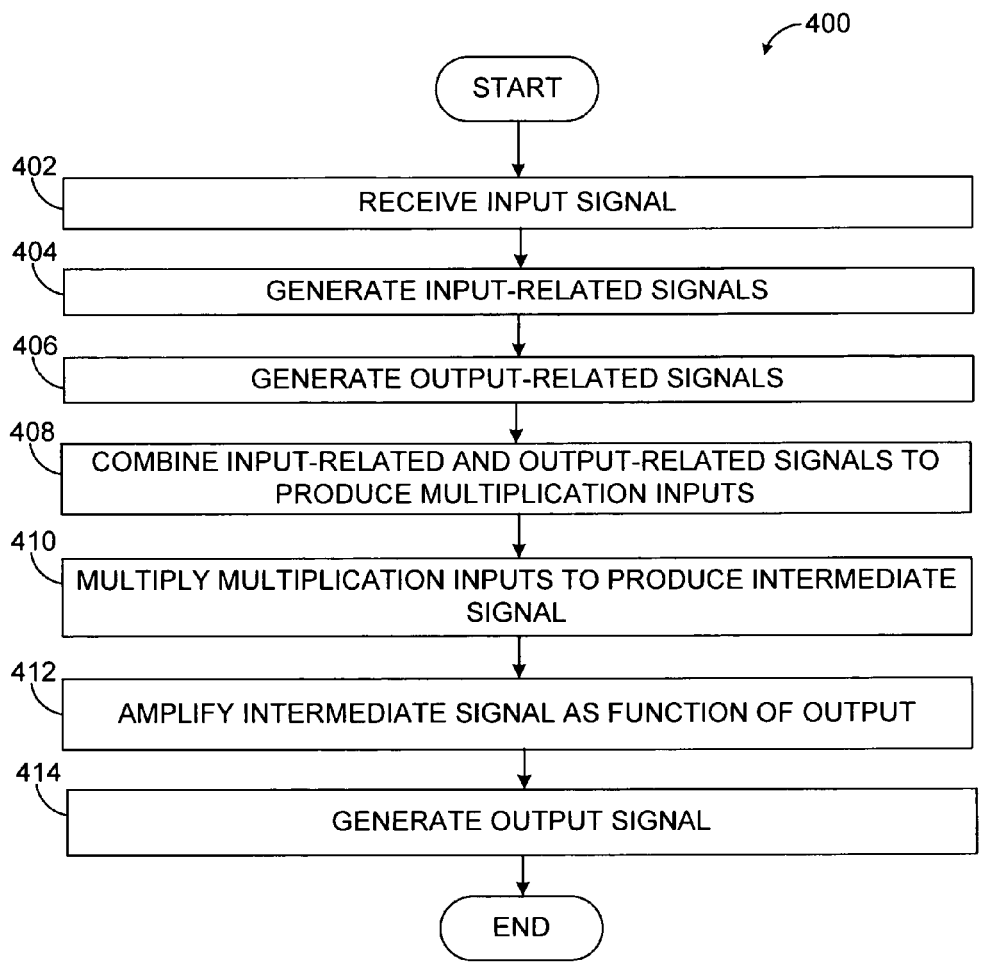
FIG. 4 illustrates an example method for RMS power detection with signal-independent dynamics according to this disclosure.

FIG. 4 illustrates an example method 400 for RMS power detection with signal-independent dynamics according to this disclosure. The embodiment of the method 400 shown in FIG. 4 is for illustration only. Other embodiments of the method 400 could be used without departing from the scope of this disclosure.

An input signal is received at an RMS power detector at step 402. This could include, for example, receiving a differential or single-ended input voltage $V_{IN}$. Input-related signals are generated at step 404. This could include, for example, generating substantially equal input-related currents $I_{IN}$ based on the input voltage $V_{IN}$ using voltage-to-current amplifiers. Output-related signals are generated at step 406. This could include, for example, generating substantially equal output-related currents $I_{OUT}$ based on a current output voltage $V_{OUT}$ of the RMS power detector.

The input-related and output-related signals are combined to produce multiple multiplication inputs at step 408. This could include, for example, generating a first current $I_1$ equal to $I_{IN}$ plus $I_{OUT}$. This could also include generating a second current $I_2$ equal to $I_{IN}$ minus $I_{OUT}$. The multiplication inputs are multiplied to produce an intermediate signal at step 410. This could include, for example, multiplying the currents $I_1$ and $I_2$ using a mixer to produce an intermediate current $I_x'$.

The intermediate signal is amplified as a function of the RMS power detector's output at step 412. This could include, for example, amplifying the intermediate current $I_x'$ using one or more controlled amplifiers to produce a current $I_x$. A single controlled amplifier could be used, or a series of two or more controlled amplifiers could be used. In particular embodiments, each controlled amplifier could receive the output-related current $I_{OUT}$ (or a scaled version thereof) as a control current $I_{CTRL}$.

An output signal is generated at step 414. This could include, for example, amplifying the current $I_x$ from the one or more controlled amplifiers using an additional amplifier to produce an output voltage $V_{OUT}$. At this point, the method 400 can be repeated, where the output-related signals are generated by feedback components of the RMS power detector and are now based on the new output signal of the RMS detector.

Although FIG. 4 illustrates one example of a method 400 for RMS power detection with signal-independent dynamics, various changes may be made to FIG. 4. For example, as noted above, the controlled amplifier(s) could be used at any point in the forward path of the RMS power detector. As a particular example, step 412 could involve simple amplification (not as a function of the detector's output signal), and step 414 could involve controlled amplification (as a function of the detector's output signal).

It may be advantageous to set forth definitions of certain words and phrases that have been used within this patent document. The term "couple" and its derivatives refer to any direct or indirect communication between two or more components, whether or not those components' are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A circuit configured to receive an input signal and to produce an output signal measuring a power of the input signal, the circuit comprising:
   a multiplier cell configured to multiply first and second signals, each of the first and second signals comprising a component related to the input signal and a component related to the output signal;
   at least one first converting amplifier configured to generate the component related to the input signal; and
   at least one second converting amplifier configured to generate the component related to the output signal;
   a controlled amplifier configured to amplify an intermediate signal produced by the multiplier cell, wherein an amplification provided by the controlled amplifier is a function of the output signal;
   wherein the controlled amplifier is configured to be controlled using a control signal, the control signal based on the component related to the output signal;
   wherein transconductances of the first and second converting amplifiers are selected to configure the circuit as one of: a linear root mean square (RMS) power detector and a logarithmic RMS power detector;
   two first voltage-to-current amplifiers configured to generate substantially equal input related currents; and
   two second voltage-to-current amplifiers configured to generate substantially equal output-related currents;
   wherein the first signal received by the multiplier cell comprises one of the input-related currents plus one of the output-related currents; and
   wherein the second signal received by the multiplier cell comprises another of the input-related currents minus another of the output-related currents.

2. The circuit of claim 1, wherein the controlled amplifier is configured to be controlled using a control current, the control current comprising one of the output-related currents.

3. The circuit of claim 1, further comprising:
   an additional amplifier coupled between the multiplier cell and an output configured to provide the output signal.

4. The circuit of claim 3, wherein the additional amplifier is coupled to an output of the controlled amplifier and is configured to produce the output signal.

5. The circuit of claim 1, wherein the controlled amplifier comprises one of a cascaded series of two or more controlled amplifiers.

6. An apparatus comprising:
   at least one amplifier configured to amplify a signal to be transmitted;
   a power detector configured to receive an input signal based on the signal to be transmitted and to produce an output signal measuring a power of the input signal; and
   a controller configured to control the at least one amplifier based on the measured power of the input signal;
   wherein the power detector comprises:
   a multiplier cell configured to multiply first and second signals, each of the first and second signals comprising a component related to the input signal and a component related to the output signal; and a controlled amplifier configured to amplify an intermediate signal produced by the multiplier cell, wherein an amplification provided by the controlled amplifier is a function of the output signal;

wherein the power detector further comprises:

at least one first converting amplifier configured to generate the component related to the input signal; and at least one second converting amplifier configured to generate the component related to the output signal;

wherein the controlled amplifier is configured to be controlled using a control signal, the control signal based on the component related to the output signal;

two first voltage-to-current amplifiers configured to generate substantially equal input-related currents; and two second voltage-to-current amplifiers configured to generate substantially equal output-related currents;

wherein the first signal received by the multiplier cell comprises one of the input-related currents plus one of the output-related currents; and wherein the second signal received by the multiplier cell comprises another of the input-related currents minus another of the output-related currents.

7. The apparatus of claim 6, wherein the controlled amplifier is configured to be controlled using a control current, the control current comprising one of the output-related currents.

8. The apparatus of claim 6, wherein the power detector further comprises:

an additional amplifier coupled between the multiplier cell and an output of the power detector that is configured to provide the output signal.

9. The apparatus of claim 6, wherein the controlled amplifier comprises one of a cascaded series of two or more controlled amplifiers.

10. The apparatus of claim 6, wherein the at least one amplifier configured to amplify the signal to be transmitted comprises:

a variable gain amplifier configured to provide an adjustable gain under control of the controller; and a power amplifier.

11. The apparatus of claim 6, further comprising:

a filter coupled to an output of the power detector; and an analog-to-digital converter coupled to an output of the filter.

12. The apparatus of claim 6, wherein the controller is further configured to enable the power detector and to place the power detector in a low-power state.

* * * * *